United States Patent [19]

Yang et al.

[11] Patent Number: 5,313,414
[45] Date of Patent: May 17, 1994

[54] CANONICAL SIGNED TWO'S COMPLEMENT CONSTANT MULTIPLIER COMPILER

[75] Inventors: Lin Yang, Fremont; Chun-Ling Liu, Milpitas, both of Calif.

[73] Assignee: VLSI Technology, Inc., San Jose, Calif.

[21] Appl. No.: 976,164

[22] Filed: Nov. 12, 1992

[51] Int. Cl.$^5$ .............................. G06F 7/52
[52] U.S. Cl. ................................... 364/757
[58] Field of Search ............................ 364/757, 754

[56] References Cited

U.S. PATENT DOCUMENTS

4,679,164  7/1987  Rearick ........................ 364/754 X

*Primary Examiner*—Tan V. Mai
*Attorney, Agent, or Firm*—Burns, Doane, Swecker & Mathis

[57] ABSTRACT

A constant multiplier compiler model allows a modified canonical signed two's complement constant multiplier circuit design to be generated from a user specification of the desired constant. A netlist of a modified canonical signed two's complement constant multiplier circuit for computing a product of a multi-bit multiplicand and a multi-bit constant is automatically generated by modifying a netlist of a precursor signed two's complement constant multiplier circuit for computing a product of the multi-bit multiplicand and a multi-bit constant that is all ones. The number of zeros in the multi-bit constant is first maximized by converting the constant to modified canonical form. Then, for each zero in the multi-bit constant, a corresponding logical column of full adders is deleted and each output signal of each adder so deleted is logically connected to a corresponding output signal in a preceding logical column of adders. Two exceptions to the foregoing rule occur. In the case of a first logical column of adders having no preceding logical column of adders, each output signal of each adder deleted is logically connected to a bit of the multi-bit multiplicand. In the case of a logical row of adders receiving a most significant bit of the multi-bit multiplicand, each output signal of each adder deleted is logically connected to one of the most significant bit of the multi-bit multiplicand and logic zero. The method produces a minimum layout, minimizing silicon cost, and produces a high performance design with critical paths optimized in terms of time delay.

1 Claim, 12 Drawing Sheets

MULTIPLICAND = "11111111"
CONSTANT = "01100101"

TYPE 0 — FIRST KIND — FIG._11A-1
TYPE 1 — SECOND KIND — FIG._11A-2
TYPE 2 — THIRD KIND — FIG._11A-3
TYPE A — FOURTH KIND — FIG._11A-4

FIFTH KIND — FIG._11C-1
SIXTH KIND — FIG._11C-2

FIG._11B

$C_{o\_out} = S_7 \cdot \bar{C}_7$ $S_{um} = C_{in} \oplus (S_7 \oplus \bar{C}_7) \oplus C_{o\_in}$ $C_{out} = C_{in} \cdot (S_7 \oplus \bar{C}_7) + C_{o\_in} \cdot (S_7 \oplus \bar{C}_7) + C_{in} \cdot C_{o\_in}$

CANONICAL SIGNED TWO'S COMPLEMENT CONSTANT MULTIPLIER COMPILER

BACKGROUND OF THE INVENTION

1. Field of the Invention

The present invention relates to computer-aided integrated circuit design tools. In particular, the invention relates to circuits and methods for use in a data path compiler, an integrated circuit design tool that translates a functional description of datapath elements into a hardware realization.

2. State of the Art

Datapath compilers are known in the art. These computer-aided integrated circuit design tools accept a functional user specification of desired datapath elements and from that specification generate a hardware circuit layout that realizes the desired function. The desired function may be a simple counting function. Often, however, the function is arithmetic. For example, the user may specify that a data word be added together with a predefined constant. The datapath element that performs this function may be referred to as a constant adder. Similarly, the user may specify that a data word be multiplied by a predefined constant. The datapath element that performs this function may be referred to as a constant multiplier. As used herein, the term "constant multiplier" refers to a special-purpose multiplier that multiplies a data word by a fixed, signed or unsigned constant. To accommodate variable word length and arbitrary constants, constant multipliers have typically required detailed design by a design engineer. That is, constant multipliers have not been readily compilable.

SUMMARY OF THE INVENTION

The present invention, generally speaking, provides a constant multiplier compiler model according to which a signed two's complement constant multiplier circuit design may be generated from a user specification of the desired constant. The model may be expressed both in terms of an apparatus and a method. In accordance with one embodiment of the invention, a signed two's complement constant multiplier circuit for computing a product of a multi-bit multiplicand and a multi-bit constant uses full adders each having three input terminals and two output terminals, a Sum output terminal and a Carry output terminal, certain ones of the input and output terminals being weighted so as to represent positive and negative numbers and certain others of the input terminals being of an inverting type for complementing the multiplicand. An interconnected array of full adders is logically arranged in rows and columns, full adders in an input column each receiving different ones of the bits of the multi-bit multiplicand and full adders in each of two output columns each producing a product bit. Each column besides the output columns produces a partial product, and each full adder in each row in columns besides the output columns receives a same one of the bits of the multi-bit multiplicand. A number of columns is less than the number of bits in the multiplicand, the array of full adders being interconnected such that partial products corresponding to zeros in the multi-bit constant are not produced. The number of zeros in the multi-bit constant may be maximized by converting the constant to modified canonical form.

In another embodiment of the invention, a netlist of a signed two's complement constant multiplier circuit for computing a product of a multi-bit multiplicand and a multi-bit constant is automatically generated by modifying a method of generating a netlist of a precursor signed two's complement constant multiplier circuit for computing a product of the multi-bit multiplicand and a multi-bit constant that is all ones. The number of zeros in the multi-bit constant is first maximized by converting the constant to modified canonical form. Then, for each zero in the multi-bit constant, a corresponding logical column of full adders is deleted and each output signal of each adder so deleted is logically connected to a corresponding output signal in a preceding logical column of adders. Two exceptions to the foregoing rule occur. In the case of a first logical column of adders having no preceding logical column of adders, each output signal of each adder deleted is logically connected to a bit of the multi-bit multiplicand. In the case of a logical row of adders receiving a most significant bit of the multi-bit multiplicand, each output signal of each adder deleted is logically connected to one of the most significant bit of the multi-bit multiplicand and logic zero. The method produces a minimum layout, minimizing silicon cost, and produces a high performance design with critical paths optimized in terms of time delay.

BRIEF DESCRIPTION OF THE DRAWINGS

The present invention may be further understood from the following written description in conjunction with the appended drawings. In the drawings:

FIG. 11(a), comprising FIGS. 11A-1, 11A-2, 11A-3 and 11A-4, is a diagram of the symbols of different types of generalized, weighted full adders;

FIG. 11(c), comprising FIGS. 11C-1 and 11C-2, is a diagram representing two additional kinds of adders;

DETAILED DESCRIPTION OF THE PREFERRED EMBODIMENTS

Figure 1:
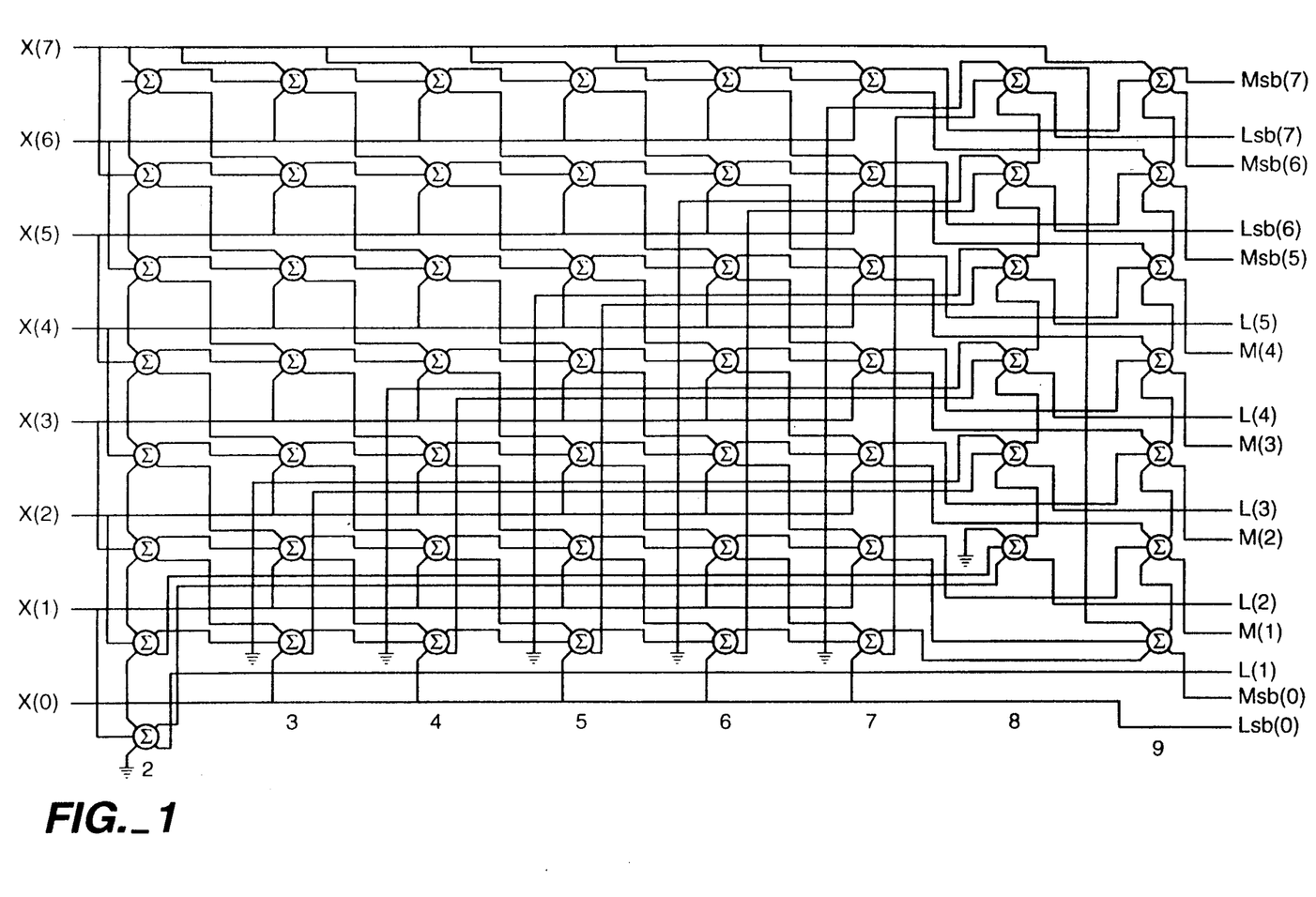
FIG. 1 is a schematic diagram of a precursor unsigned constant multiplier circuit in which the constant is "11111111"

The present invention relates particularly to modified canonical signed two's complement constant multipliers. To facilitate an understanding of the invention, however, unsigned and signed constant multipliers will first be described and their operation explained. Referring to FIG. 1, an unsigned constant multiplier that multiplies an 8-bit input word by "11111111", or $255_{10}$, may be realized as shown by an interconnected array of full adders logically arranged in rows and columns. The present constant multiplier compiler is concerned only with the logical arrangement, or interconnection, of the full adders and not with their actual physical layout. Given a netlist of a circuit, physical design may be accomplished using any of numerous commercially available design layout programs.

Figure 3:
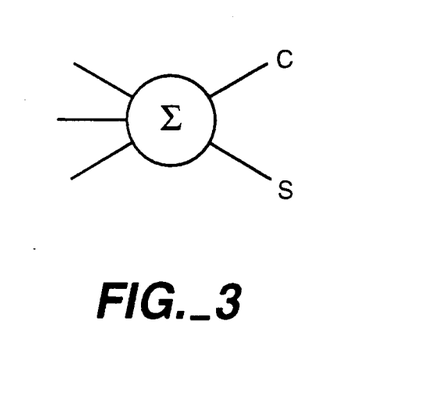
FIG. 3 is the symbol of a generalized full adder.

An 8-bit unsigned constant multiplier may be realized using $7 \times 8 = 56$ generalized full adders of the type shown in FIG. 3. The adder has three input terminals and two output terminals, a Sum terminal and Carry terminal. The adder produces the output signals (C=0, S=0) if the total number of logic ones input to the three input terminals is 0, (C=0, S=1) if the total number of logic ones input to the three input terminals is one, (C=1, S=1) if the total number of logic ones input to the three input terminals is two, and (C=1, S=1) if the total number of ones input to the three input terminals is three.

Referring again to FIG. 1, the full adders are arrayed in substantially a $7 \times 8$ array, except that a first column has eight rows instead of seven, and a next-to-last column has six rows instead of seven. For convenience, the columns are designated as column 2, column 3, . . . , column 9. Column 2 adds the contribution of the first three bits (bits 0–2) of the constant to the final product, column 3 adds the contribution of the third bit of the constant, column 4 adds the contribution of the fourth bit of the constant, and so on up to column 7. Columns 8 and 9 together perform a final summation and constitute output columns, each of the adders in these two columns producing a bit of the output word. A most significant byte and a least significant byte of the output word are interleaved as shown. The first column, column 2, receives as inputs the bits of the multiplicand, X(0)–X(7).

The rows of the adder array are designated 0–7. Row 0 is occupied only in the case of column 2.

The adders are interconnected in a manner specified in Table 1 below. For example, adder 36, the adder in column 3 and row 6, receives as its inputs bit 5 of the input word, the carry output of adder 26, and the sum output of adder 27.

TABLE 1

| ADDER | INPUTS | ADDER | INPUTS |
|---|---|---|---|
| 20 | (0) (1) | | |
| 21 | (0) (1) (2) | 61 | (0) C51 S52 |
| 22 | (1) (2) (3) | 62 | (1) C52 S53 |
| 23 | (2) (3) (4) | 63 | (2) C53 S54 |

TABLE 1-continued

| ADDER | INPUTS | ADDER | INPUTS |
|---|---|---|---|
| 24 | (3) (4) (5) | 64 | (3) C54 S55 |
| 25 | (4) (5) (6) | 65 | (4) C55 S56 |
| 26 | (5) (6) (7) | 66 | (5) C56 S57 |
| 27 | (6) (7) | 67 | (6) (7) C57 |
| 31 | (0) C21 S22 | 71 | (0) C61 S62 |
| 32 | (1) C22 S23 | 72 | (1) C62 S63 |
| 33 | (2) C23 S24 | 73 | (2) C63 S64 |
| 34 | (3) C24 S25 | 74 | (3) C64 S65 |
| 35 | (4) C25 S26 | 75 | (4) C65 S66 |
| 36 | (5) C26 S27 | 76 | (5) C66 S67 |
| 37 | (6) (7) C27 | 77 | (6) (7) C67 |
| 41 | (0) C31 S32 | | |
| 42 | (1) C32 S33 | 82 | C20 21 |
| 43 | (2) C33 S34 | 83 | C82 S31 |
| 44 | (3) C34 S35 | 84 | C83 S41 |
| 45 | (4) C35 S36 | 85 | C84 S51 |
| 46 | (5) C36 S37 | 86 | C85 S61 |
| 47 | (6) (7) C37 | 87 | C86 S71 |
| 51 | (0) C41 S42 | 91 | C71 S72 C87 |
| 52 | (1) C42 S43 | 92 | C72 S73 C91 |
| 53 | (2) C43 S44 | 93 | C73 S74 C92 |
| 54 | (3) C44 S45 | 94 | C74 S75 C93 |
| 55 | (4) C45 S46 | 95 | C75 S76 C94 |
| 56 | (5) C46 S47 | 96 | C76 S77 C95 |
| 57 | (6) (7) C47 | 97 | C77 (7) C96 |

Figure 4:
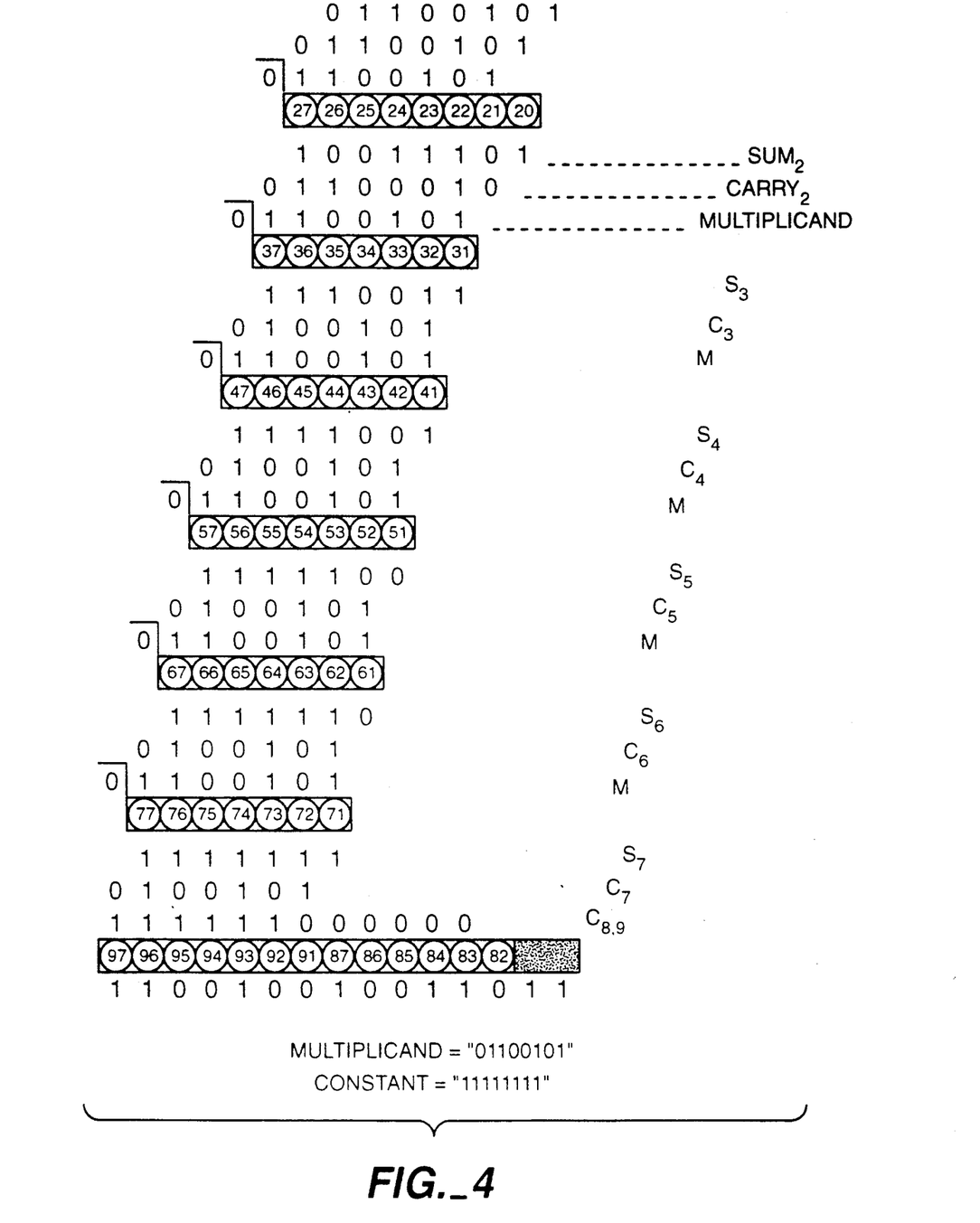
FIGS. 4 and 5 are representations of the unsigned multiplication operation "11111111"×"01100101" as that multiplication might be performed using a circuit like that of FIG. 1.

Operation of the unsigned constant multiplier of FIG. 1 may be more fully understood from the example of FIG. 4. Assume that the input word is "01100101" and that the constant is "11111111". The input word is therefore added to itself seven times, each time being shifted left one additional bit position. On the first line of FIG. 4, the input word "01100101" is written, on the next line the input word shifted left one bit position is written, and on the following line the input word shifted left one additional bit is written. Using the full adders in column 2, a partial product is then formed by adding together the first three lines. Note that addition of the right-most bit of the first line is not required; rather, this bit is output directly as LSB(0). Also, not that addition of the left-most bit on the third line is reserved for the next column of adders, column 3. The results of the addition of column 2 are "10011101" (sum) and "01100010" (carry). The carry result is written shifted one left with respect to the sum result.

The data word, shifted left the appropriate number of times, is then again added, this time in column 3. Operation proceeds in this manner until columns 8 and 9. In a final summation, the least significant bit of the input word is output as the least significant bit of the product, and $S_{20}$ is output as the next significant bit. Adder 82 then adds $S_{21}$ and $C_{20}$. $S_{82}$ is output as the next significant bit of the product, and $C_{82}$ is input to adder 83 to be added with $S_{31}$. Operation proceeds in this manner until adder 91. Adder 91 adds $S_{72}$, $C_{71}$ and $C_{87}$. $S_{91}$ is output as part of the product and $C_{91}$ is input to adder 92 to be added with $S_{73}$ and $C_{72}$, etc. The sum bit and the carry bit of the final adder (adder 97) are output as part of the product.

Figure 5:
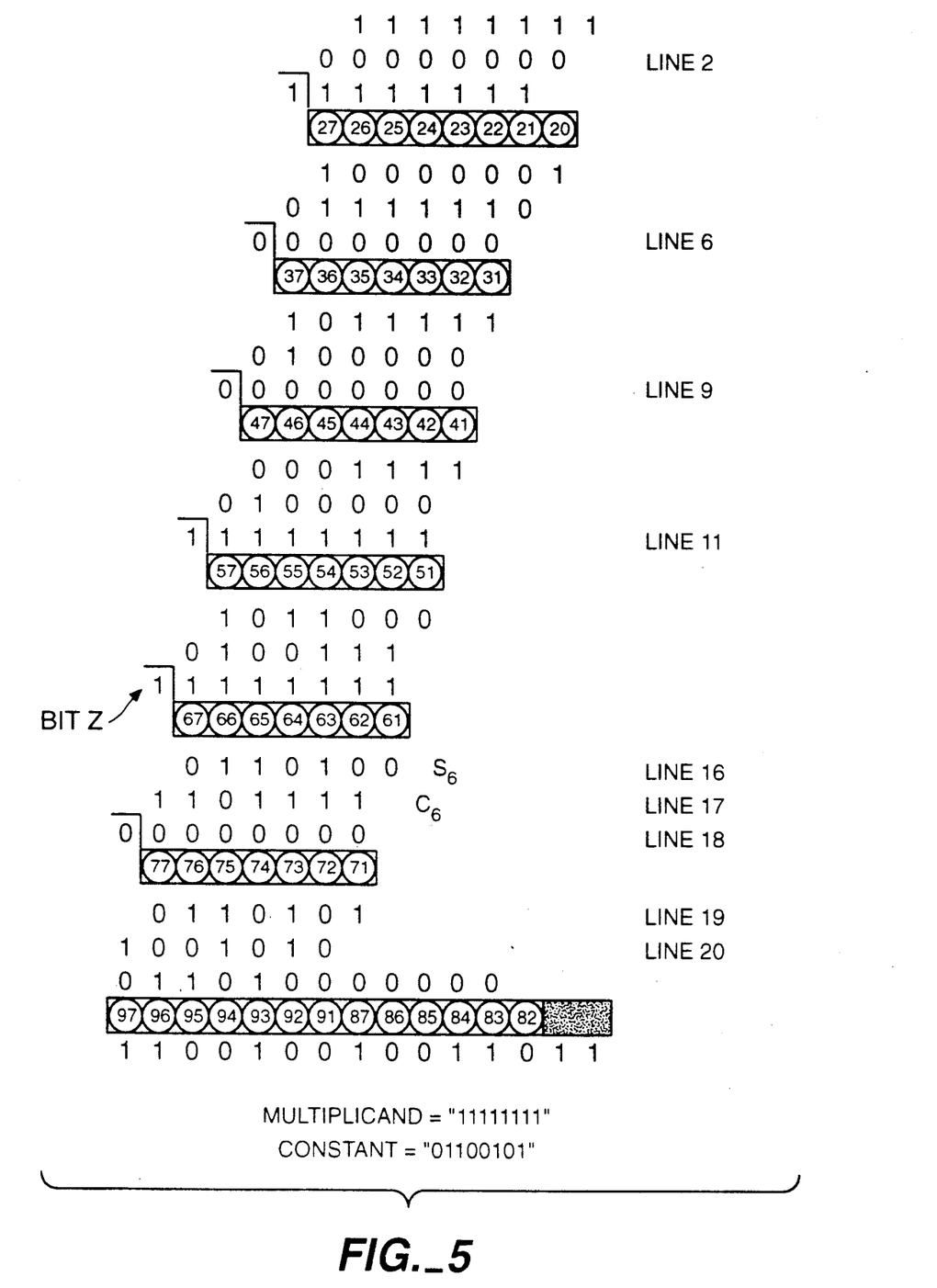

In FIG. 5, the same calculation is performed, but the multiplicand and the constant are now assumed to be reversed; i.e., the multiplicand is now "11111111" and the constant is now "01100101". Operation proceeds as in FIG. 4. Note that in lines 2, 6, 9, 11 and 18, however, zero is added to a previous result, unnecessarily so. By eliminating these unnecessary additions, the unsigned constant multiplier may be made smaller and faster. Unnecessary additions are eliminated by, using the circuit of FIG. 1 as a prototype, removing corresponding columns of adders. In general, each output signal of each adder deleted is logically connected to a corresponding output signal in a preceding logical column of adders, with the following exceptions. In the case of a first logical column of adders having no preceding logical column of adders, each output signal of each adder deleted is logically connected to a bit of the multiplicand. Also, in the case of the top-most row of adders, each output signal of each adder deleted is logically connected to either the most significant bit of the multiplicand or to logic 0. The resulting circuit and its corresponding operation for constant "01100101" are shown in FIGS. 2 and 6, respectively.

Figure 6:
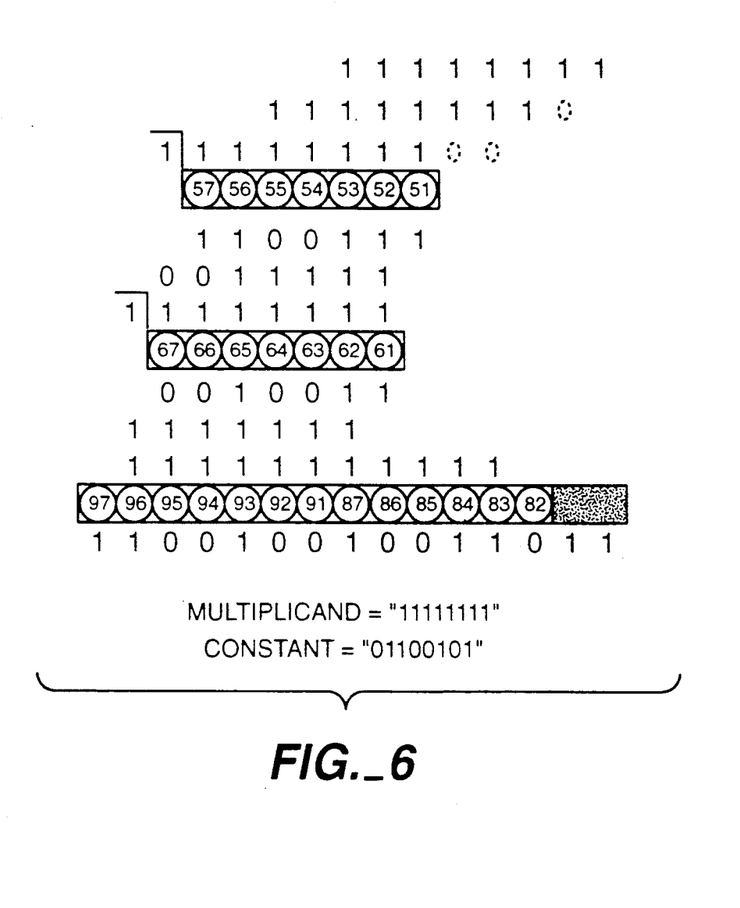
FIG. 6 is a representation of the same multiplication operation as performed by the circuit of FIG. 2.

Referring first to FIG. 6, on the first line, the input word is entered in correspondence to the least significant bit of the constant, which is a one. On the next line, if the next significant bit of the constant were a one, the input word would be entered again, shifted one to the left. Since the next significant bit of the constant is a zero, however, a place-keeping zero, shown in phantom outline, is entered. The next significant bit of the constant is a one. The input word, shifted left twice with respect to the input word on the first line, is therefore entered on the second line next to the phantom zero. The next two bits of the constant are zeros. On the third line, two phantom place-keeping zeros are therefore entered. The next bit of the constant is a one. The input word, shifted to the left three times with respect to the input word on the second line, is therefore entered on the third line next to the place-keeping zeros. Bits 0-5 of the constant have then been accounted for, and column 5 of the adders is used to perform the addition. The next bit of the constant is a one and is the final one in the constant. The input word, shifted one to the left with respect to the input word on line 3, is therefore entered on line 6, and the column 6 adders are used to perform the addition. The column 8 and 9 adders are then used to perform the final summation. These columns are output-producing columns and are never removed from the circuit. Comparing FIG. 6 to FIG. 5, the same result is obtained much more compactly using four fewer columns of adders.

Figure 2:
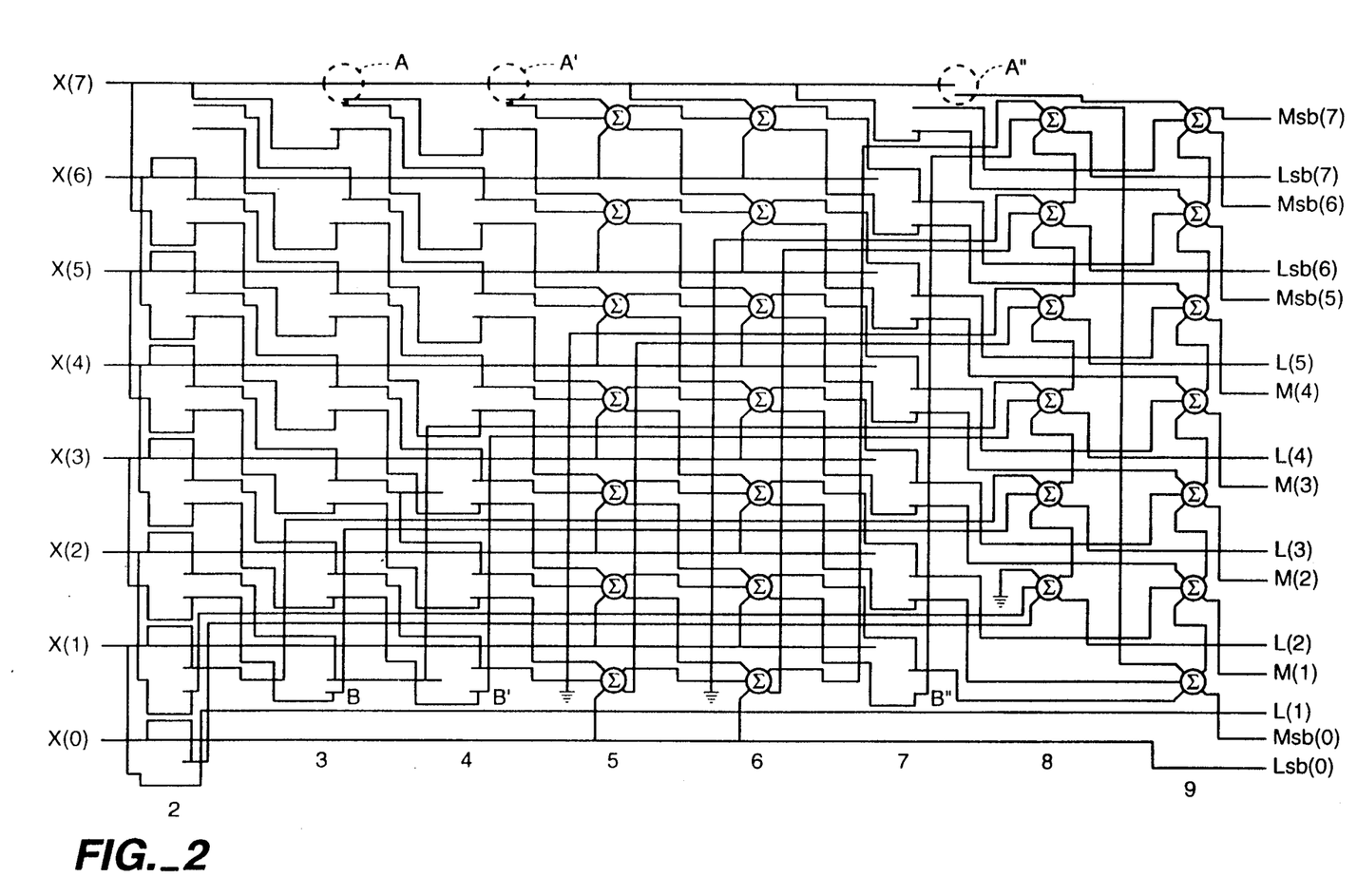
FIG. 2 is a schematic diagram of a modified unsigned constant multiplier circuit in which the constant is "01100101"

Referring to FIG. 2, adder columns 2, 3, 4 and 7 have been removed as compared to FIG. 1. With adder 71 removed, $S_{71}$ is connected to $S_{62}$, and $C_{71}$ is connected to $C_{62}$. With adder 72 removed, $S_{72}$ is connected to $S_{63}$, and $C_{72}$ is connected to $C_{62}$, etc. In terms of FIG. 5, this corresponds to bringing $S_6$ and $C_6$ from lines 16 and 17 down to lines 19 and 20. In the case of adder 77, with $C_6$ moved from line 17 down to line 19, only the most significant bit of the input word, "BIT Z" in FIG. 5., remains to be added by adder 77. $S_{77}$ is therefore connected to X(7). In general, if column y is removed, $S_{y7}$ is connected to X(7) if bit X-1 of the constant is a one and is connected to logic 0 if bit X-7 of the constant is a zero.

In the case of columns 3 and 4, the sum and carry outputs of each adder in rows 1-6 are connected to the sum and carry outputs of the adder in the next higher row in the preceding column. For example, $S_{41}$ is connected to $S_{32}$, which is in turn connected to $S_{23}$. In the case of adder 47, since bit 3 of the constant is zero, $S_{47}$ remains unconnected, or is connected to logic 0. In the case of adder 37, bit 2 of the constant is one. $S_{37}$ is therefore connected to X(7).

Note that in circled regions A, A' and A", the connections of adders 37, 47 and 97 to X(7) have been disconnected. In general, when a column is removed, the next row 7 adder connected to X(7) is disconnected from X(7). Also, at points B, B' and B", the inputs to the column 8 adders that in FIG. 1 are grounded, or tied to logic zero, are connected instead to the carry output of the first adder in the preceding column for each of columns 3-7 that is removed. For example, in FIG. 2, columns 3, 4 and 7 have been removed. Corresponding ones of the inputs tied to ground in FIG. 1 are therefore connected instead to $C_{21}$, $C_{31}$ and $C_{61}$, respectively.

Connection of the outputs of the adders of columns 3, 4 and 7 as previously described is relatively straight-forward. Connection of the outputs of the adders in column 2 is somewhat more involved. Connection depends on the value of the shortest, least-significant portion of the constant that contains three ones. In the present example, the shortest least-significant portion of the constant that contains three ones is "100101". The shortest possible least significant portion of the constant that could contain three ones is, of course, "111". In the latter case, the column 2 adders are not removed but remain in the circuit. In all other cases, the column 2 adders are removed. Connection of the outputs of the column 2 adders then depends particularly on the number ($N_1$) of intervening zeros between the first logic 1 in the constant and the next logic 1 in the constant, as well as the number ($N_2$) of intervening zeros between the second logic 1 in the constant and the next logic 1 in the constant. The sum $N_1+N_2+2$ indicates the first column of adders to remain in the circuit.

Figure 7:
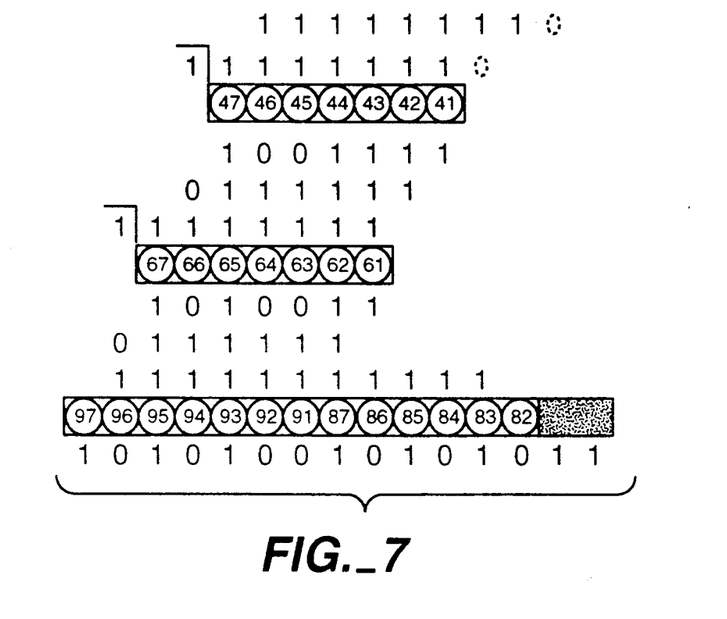
FIG. 7 is a representation of the unsigned multiplication operation "11111111"×"01010101"

The method of determining connections of the sum and carry outputs of column 2 may best be appreciated from a concrete example. Assume, for example, that the constant is "01010101". Therefore, $N_1=N_2=1$, and $N_1+N_2+2=4$, indicating that column 4 will be the first adder column to remain in the circuit. The multiplication may be performed as illustrated in FIG. 7.

Figure 8:
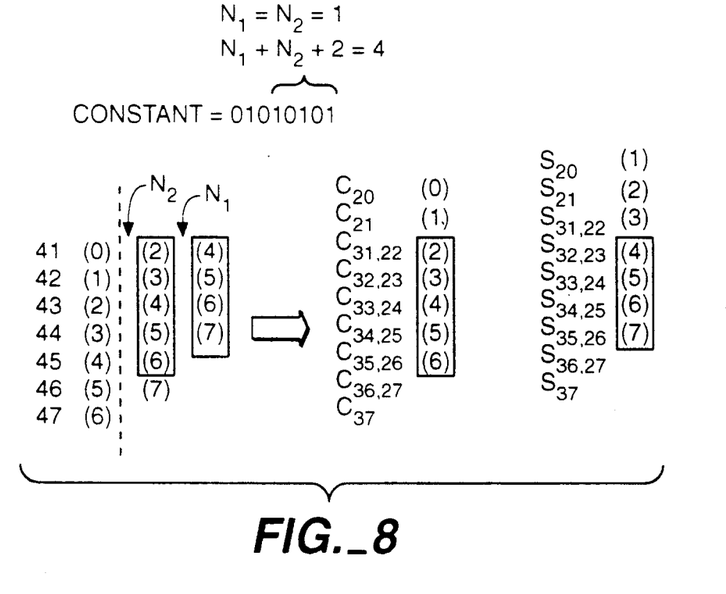
FIG. 8 is a diagram representing how connections of the sum and carry outputs in column 2 of FIG. 9 may be determined.

Referring to FIG. 8, the inputs to column 4 adders are listed on the left-hand side of the figure. The inputs to the adders listed in the left-most column of FIG. 8 always proceed in the sequence (0), (1), . . . , (6). The inputs in the next column are determined by the distance $N_2$. If $N_2$ were zero, the inputs in the second column would all be one greater than the inputs in the first column. Since $N_2=1$, however, the inputs in the second column are all two greater than the inputs in the first column. Similarly, the distance $N_1$ determines the relationship between the inputs in the third column and those in the second column.

Based on the inputs to the column 4 adders shown on the left-hand side of FIG. 8, the connections of the sum and carry outputs of column 2, listed on the right-hand side of the figure, may be determined. In order to provide the input (2) to adder 41, $C_{31}$ must be connect to (2). $C_{31}$ is connected in turn, however, to $C_{22}$, requiring that $C_{22}$ be connected to (2). In this manner, each of the carry signals $C_{20}$, $C_{21}$, . . . , $C_{27}$ is determined in ordered sequence.

For J=3 to 7 and K=1 to 6, each of the adders JK receives as an input signal a carry output signal from an adder in the same row in the previous column. With respect to the S outputs, however, each of the adders receives as an input signal the sum output signal from a next higher row in the previous column. In order to provide (4) to adder 41, the sum output signal $S_{32}$ must therefore be connected to (4). $S_{32}$ is connected in turn, however, to $S_{23}$. In this manner, connections of each of $S_{20}$, $S_{21}$, . . . , $S_{27}$ may be determined in ordered sequence.

Figure 9:
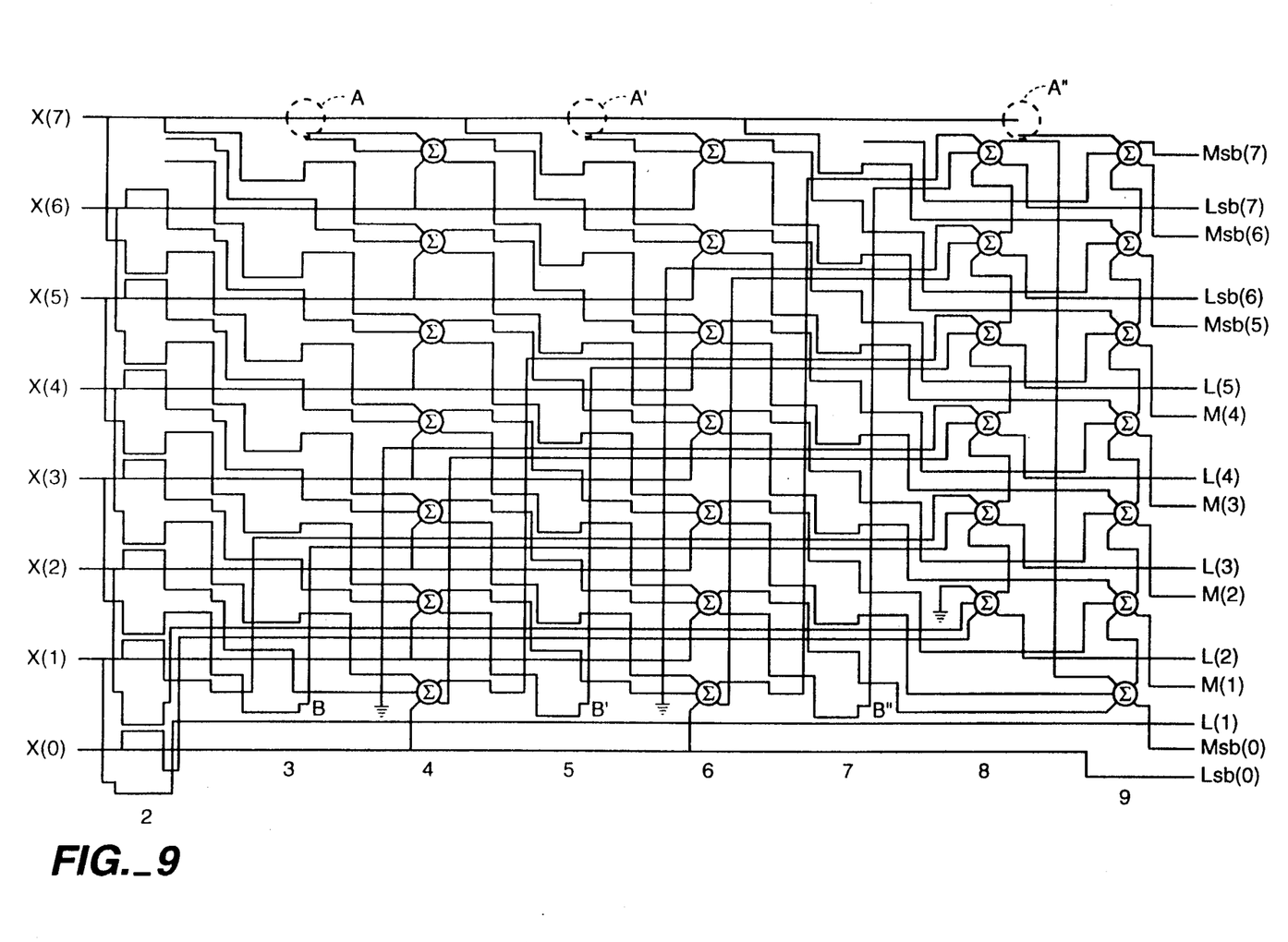
FIG. 9 is a schematic diagram of a modified unsigned constant multiplier circuit in which the constant is "01010101"

Having determined the connections of the sum and carry outputs of column 2, the circuit of FIG. 1 may be modified in accordance with the rules developed above. Since $N_1+N_2+2=4$, column 4 will be the first column of adders to remain in the circuit. Columns 2 and 3, therefore, are removed. Column 5 is removed, since bit 5 of the constant is zero, and column 7 is removed since bit 7 of the constant is also zero. For each of the adders in rows 1-6 in columns 3, 5 and 7, the sum and carry output signals are connected to the sum and carry output signals of a next higher row in the previous column. Hence $S_{71}$ is connected to $S_{62}$, $C_{71}$ is connected to $C_{62}$, etc. In the case of adders 37, 57 and 77, the sum bit is connected to X(7), and the connections of X(7) to adders 41, 61 and 91 are broken in regions A, A' and A", respectively. In regions B, B' and B", the inputs to the column 8 adders are connected to the carry output of the first adder in the preceding column. Finally, the sum and carry outputs of the column 2 adders are connected as determined in relation to FIG. 8.

The rules developed above are written into a knowledge base of the constant multiplier compiler. The compiler is designed to run on an engineering workstation, for example a 33 MIPS super-mini computer. After the designer has specified the desired constant, the constant multiplier compiler determines connections of the various adders to arrive at a final netlist.

Once the proper connections have been made and the final netlist has been determined, the netlist may be input to a physical design tool for actual layout of the physical circuit. During layout of the physical circuit, the extra space that would have been occupied by the adders that were removed from the circuit is compacted out of the final design. Size of the circuit is therefore decreased and speed of the circuit is increased.

The principles developed above in relation to an unsigned constant multiplier compiler may be applied to equal advantage in a signed two's complement constant multiplier compiler. The signed two's complement constant multiplier uses, in addition to the generalized full adder shown in FIG. 3, different types of generalized adders having negatively weighted inputs and outputs. Negatively weighted inputs and outputs allow both positive and negative numbers to be represented.

Figure 10:
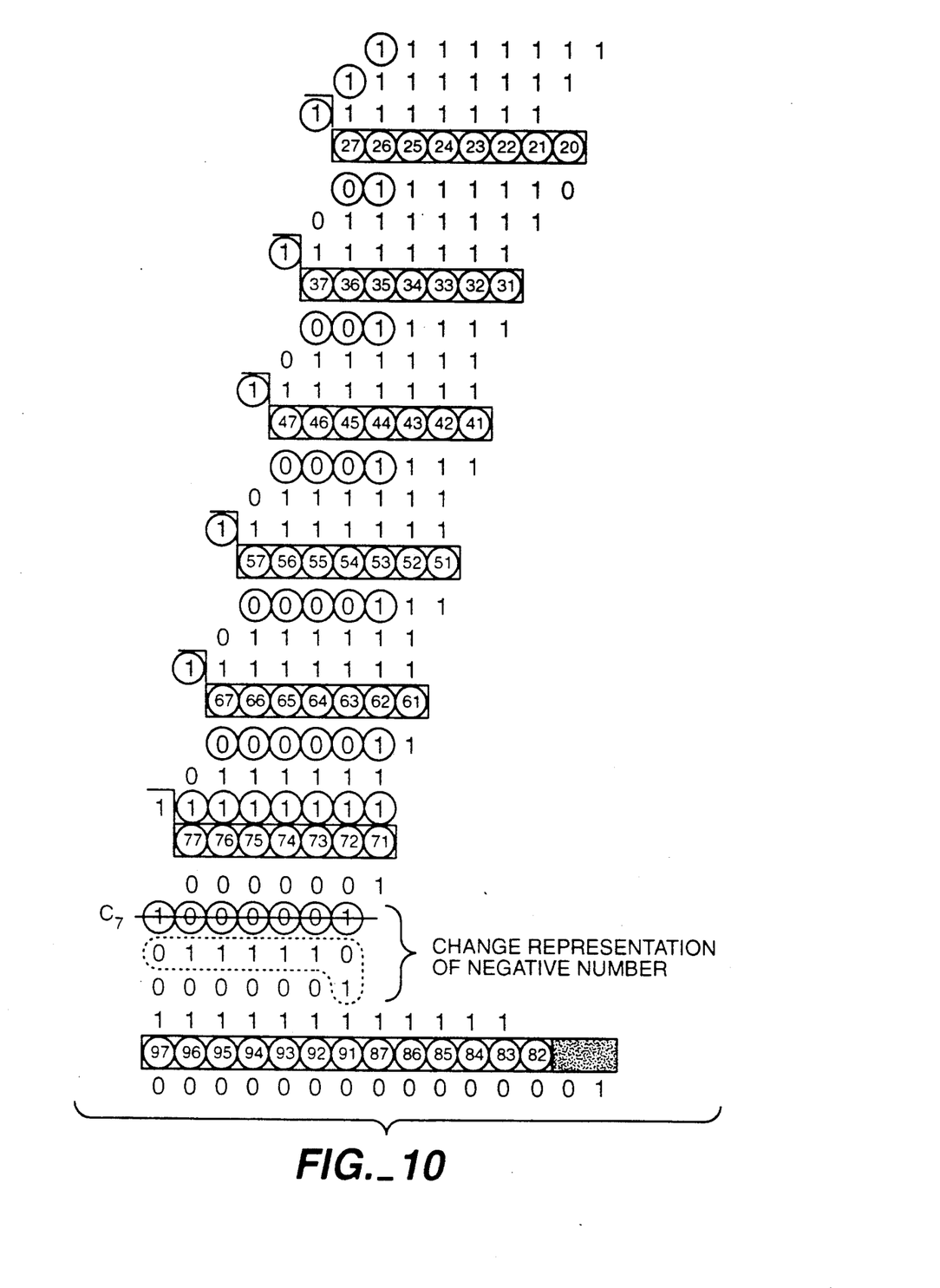
FIG. 10 is a representation of the signed two's complement multiplication operation "11111111"×"11111111"

Referring to FIG. 10, the signed two's complement multiplication operation "11111111"×"11111111" is represented. The calculation in base 10 is $(-1)\times(-1)=1$. The calculation is performed by adding the input word to itself seven times, each time being shifted left one additional bit position. On the first line of FIG. 10, the input word "11111111" is written. The most significant bit of the input word is circled, representing that it is negatively weighted. That the input word as written on line 1 represents $(-1)$ may be confirmed by noting that the most significant bit represents $-10000000$, which is 1 greater in magnitude than $+01111111$ represented by the remaining bits of the input word. On the next line, the input word shifted left one bit position is written, and on the following line the input word shifted left one additional bit is written. A partial product is now formed by adding together the first three lines. Since one input to each of adders 26 and 27 is negatively weighted, the sum output of each of these adders must also be negatively weighted. The carry outputs of the two adders remain positively weighted. Adder 26 therefore performs the operation $(-1)+1+1=1$. This result is represented by placing ones on both the positively weighted carry output and the negatively weighted sum output; i.e., $(1\times2^1)+((-1)\times2^0)=1$. Adder 27 performs the calculation $(-1)+1=0$. Both its positively weighted carry output and its negatively weighted sum output are therefore zero.

The data word, shifted left the appropriate number of times, is then again added. Each time the input word is added, the number of adders required to have negatively weighted sum outputs increases by one. Operation proceeds in this manner until the input word is to be added a final time in line 18. At this point, a correction may be required. Up until this point, the operation has been performed based on the assumption that the constant is positive, i.e., has a most significant bit 0. If the constant is negative (has a most significant bit of one), one of two different corrections is performed based on the sign of the input word. Note that the most significant bit of the input word on line 18 is positively weighted. The remaining bits of the input word, however, are negatively weighted. The effect of this weighting is that, if the input word is positive, $2^m$ times the input word is subtracted, where m is the bit position of the most significant bit of the input word, in this case seven. If the input word is negative, $2^m$ times the magnitude of the input word is added. In other words, if the constant is negative and the input word is positive (as compared to the assumed case of both the constant and input word being positive), the accumulated amount will incorrectly have (besides an incorrect magnitude) a positive sign instead of a negative sign, in view of which sign reversal is performed by subtracting an amount greater than the accumulated amount. Similarly, if the constant and the input word are both negative, then the accumulated amount will incorrectly have a negative sign instead of a positive sign, in view of which sign reversal (and magnitude adjustment) is performed by adding an amount greater than the magnitude of the accumulated amount. Note that since two of the inputs to each of adders 71-77 are negatively weighted, the carry outputs of these adders are negatively weighted instead of the sum outputs. For example, adder 71 performs the calculation $(-1)+1+(-1)=(-1)$. This result is represented by producing ones on both the negatively weighted carry output and the positively weighted sum output; i.e., $((-1)\times2^1)+(1\times2^0)=(-1)$.

Following any necessary sign reversal, a final summation is performed but in a different manner than described previously. The negatively-weighted carry outputs of adders 71-77, which are input to adders 91-97, would normally require that the sum outputs of adders 91-97 be negatively weighted. Since the sum outputs of adders 91-97 form part of the final product, however, such negative weighting is undesirable. The representation of the negative quantity represented by $C_7$ is therefore changed by taking its two's complement, i.e., inverting each digit and then adding $+1$. The final summation is then performed. Note, however, that adder 91 and subsequent adders 92-97 are required to calculate the sum of four input bits. Also, the carry of the final adder, adder 97, is ignored and does not form any part of the product. In other words, the product of two signed number having seven-bit magnitudes is a signed number having a fourteen bit magnitude, represented in two's complement notation using a total of fifteen bits.

Figure 11A:
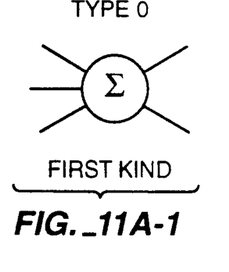
Figure 11A:
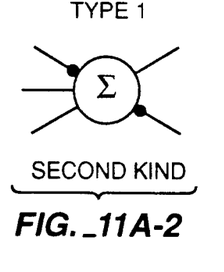
Figure 11A:
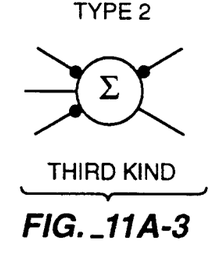
Figure 11A:
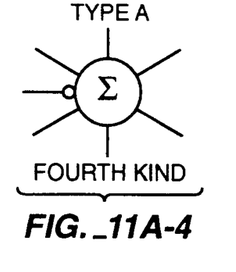

A circuit realization of the multiplication operation illustrated in FIG. 10 requires four kinds of adders of four different types as illustrated in FIG. 11(a). A first kind of adder may be classified as Type 0, since it has no negatively weighted inputs and no negatively weighted outputs. A second kind of adder may be classified as Type 1 because it has one negatively weighted input and a negatively weighted sum output. A third kind of adder may be classified as Type two because it has two negatively weighted inputs and a negatively weighted carry output. A fourth kind of adder is classified as "Type A" and is unlike the remaining adders. One of the inputs is inverted, and the adder calculates the sum of four input bits. This "Type A" adder is represented in greater detail in FIG. 11(b). The four bits input to the adder include a sum bit S from a previous column of adders (in the present example $S_7$), a carry bit C from the same column of adders ($C_7$), which is input to the inverting input of the adder, and two carry input signals, designated $C_{O-in}$ and $C_{in}$, respectively. The adder produces three output bits, a sum bit and two carry bits, $C_{o-out}$ and $C_{out}$, respectively.

Figure 11B:
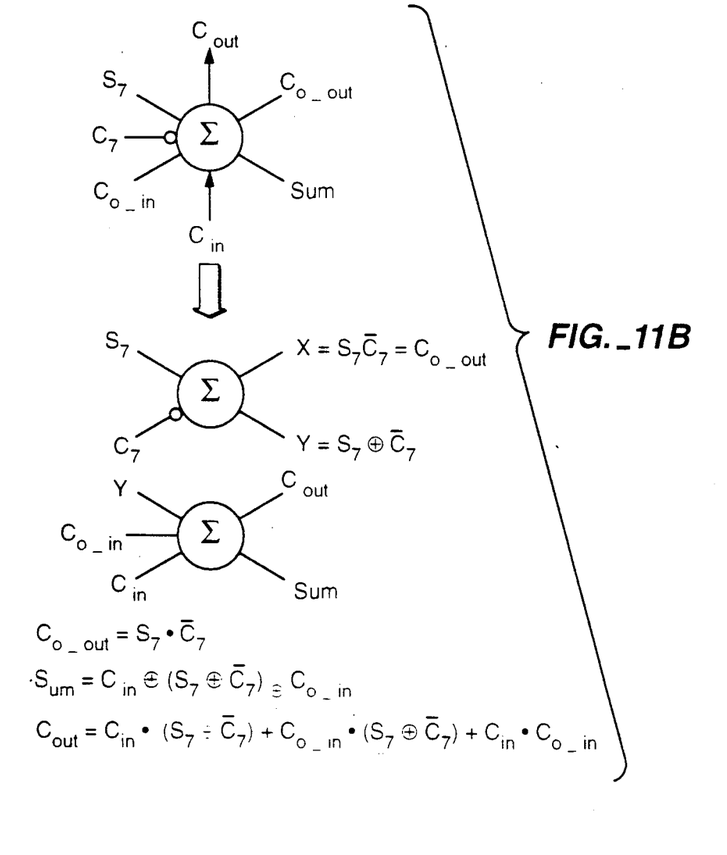
FIG. 11(b) is a diagram representing in greater detail the fourth kind of adder in FIG. 11(a)
Figure 11C:
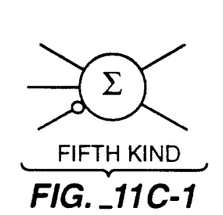
Figure 11C:
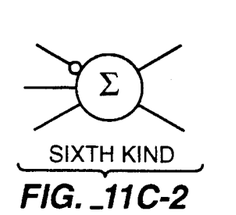

The "Type A" adder may be viewed conceptually as the combination of two simpler adders as shown in FIG. 11(b). One of the adders adds $S_7$ and the inverse of $C_7$ to produce an intermediate sum bit y and one of the carry outputs, $C_{o-out}$. The other adder adds the intermediate sum bit y and the two carry input bits $C_{o-in}$ and $C_{in}$ to produce a final sum bit and the other carry output $C_{out}$. Equations describing the output signals are shown in FIG. 11(b).

Figure 12:
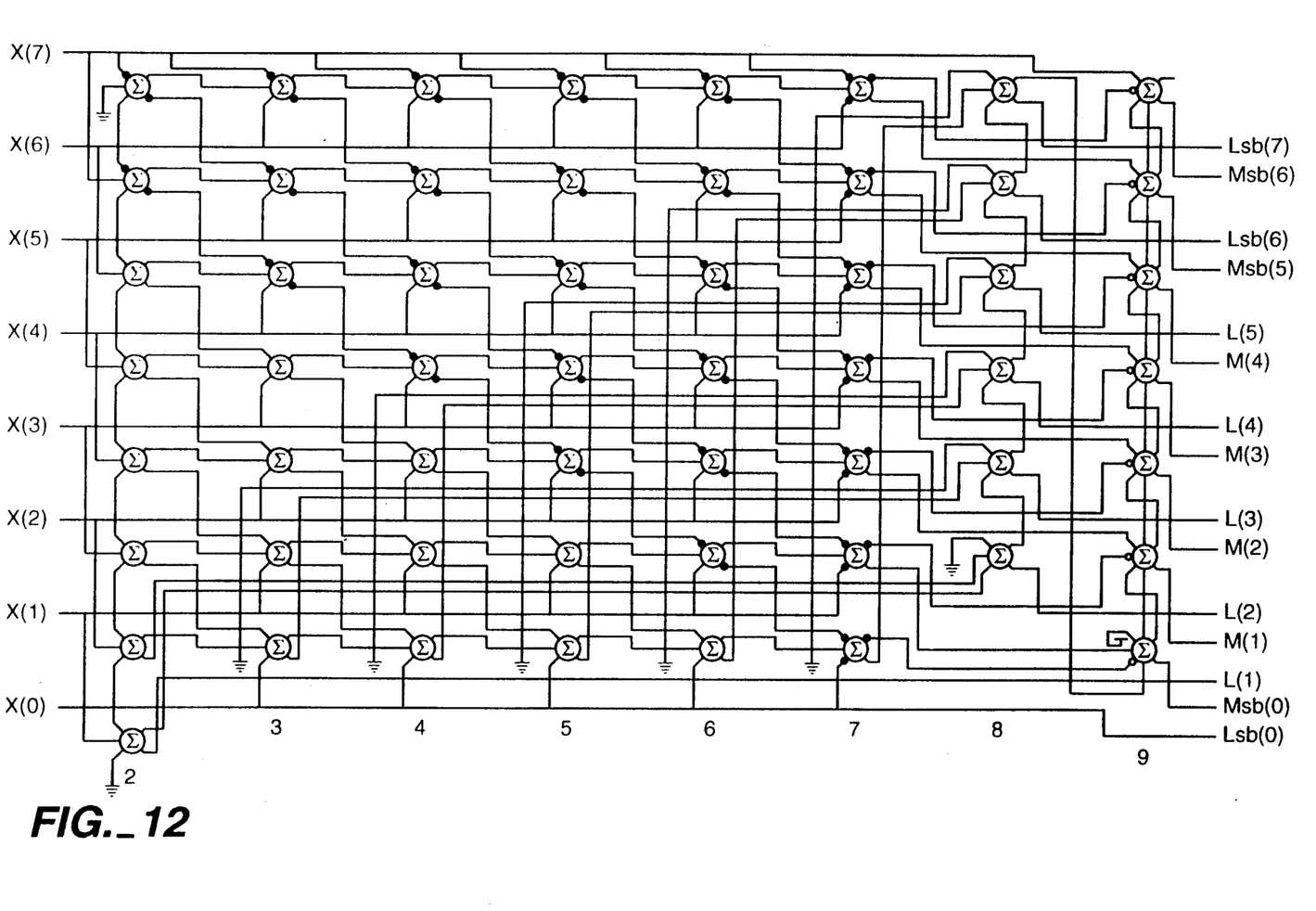
FIG. 12 is a schematic diagram of a precursor signed two's complement multiplier circuit in which the constant is "11111111"

A signed two's complement constant multiplier having a constant "11111111" may be realized as shown in FIG. 12. The circuit of FIG. 12 is identical to that of FIG. 1 with the exception that the last three kinds of adders of FIG. 11 have been substituted for certain ones of the first kind of adder exclusively used in FIG. 1. In column 2, adders 26 and 27 have been changed to the second kind of adder. Proceeding from column 3 up to column 7, the highest row in a previous column that is occupied by the first kind of adder is changed to the second kind of adder. All of the adders in column 7 are of the third kind in order to accomplish sign reversal correction if necessary. All of the adders in column 9 are of the fourth kind in order to produce an unweighted product output signal.

Figure 13:
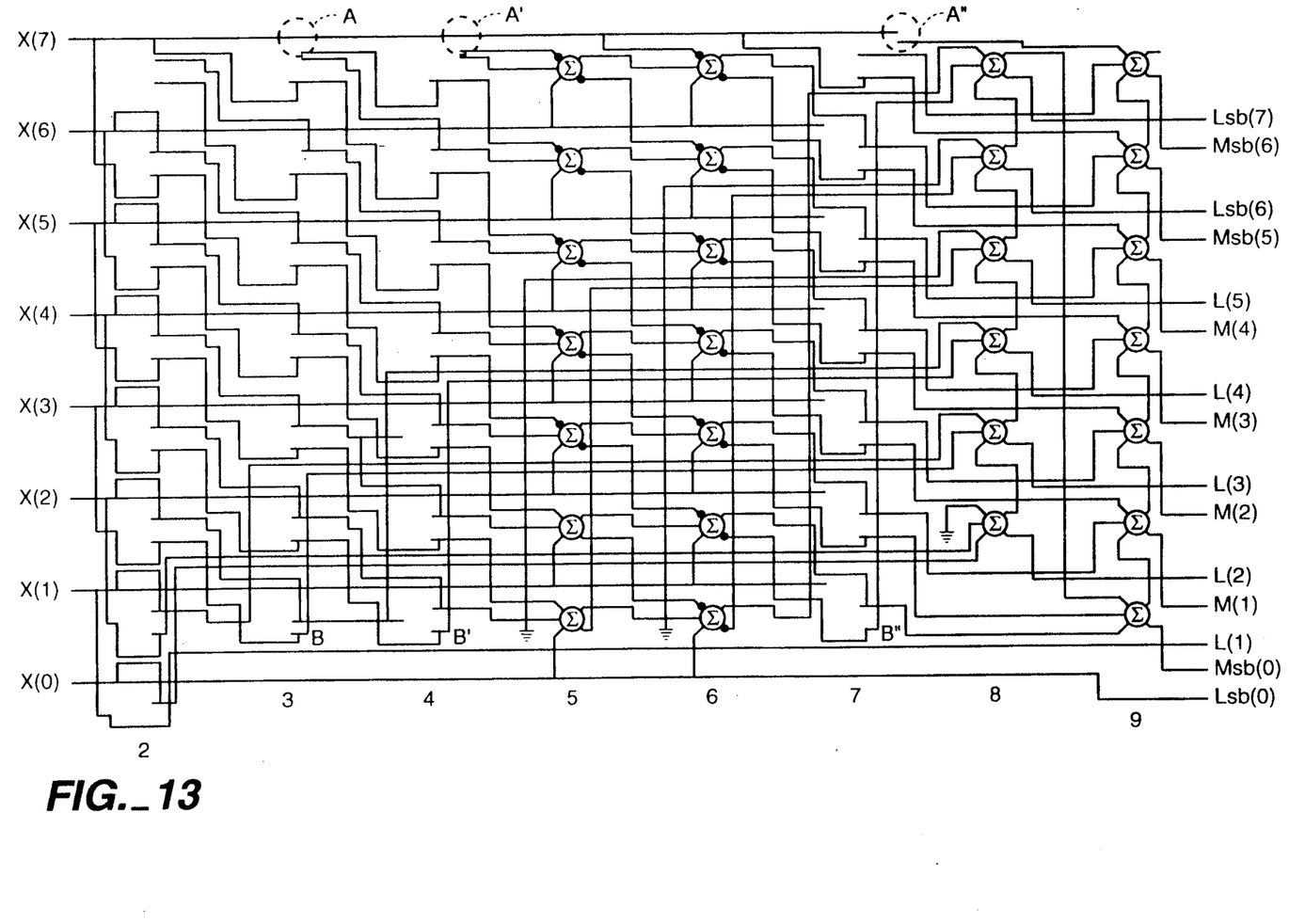
FIG. 13 is a schematic diagram of a modified signed two's complement multiplier in which the constant is "01100101"

The same rules as developed in relation to unsigned constant multipliers may be used to modify the signed two's complement multiplier of FIG. 12, serving as a precursor signed two's complement constant multiplier, to realize compact, efficient signed two's complement constant multiplier circuits for different user-specified constants. For the constant "01100101", the same modifications that were applied to the unsigned constant multiplier circuit of FIG. 1 to arrive at the circuit of FIG. 2 are now applied to the signed two's complement multiplier of FIG. 12 to arrive at the circuit of FIG. 13. In addition to the modifications previously described, if the constant is positive as is the case with "01100101", the adders in column 9 revert back to Type 0 adders.

To take fullest advantage of the signed two's complement multiplier compiler described in conjunction with FIGS. 10-13, the number of zeros in the constant should be as large as possible. This may be accomplished by converting the constant to modified canonical form. With only minor hardware modifications, an array multiplier of the type already described may be used to compute the product in a minimum of time and using a minimum of space.

In modified canonical form each digit of the constant instead of being able to take on either one of only two values, 0 and 1, is able to take on any one of three values, 0, 1 and $(-1)$. For convenience, $(-1)$ is represented as "2". In terms of hardware, when "2" is encountered in the constant, the input word is negated by taking its two's complement, i.e., inverting each bit and adding 1 to the resulting quantity. The two's complement of the input word is then added to a previous partial product to form a new partial product.

Conversion to modified canonical form saves hardware only when the constant contains at least three consecutive logic ones. For example, $+7_{10}$ is represented in two's complement form as 00000111. Adding one to this quantity gives $+8_{10}$, 00001000. Subtracting one again yields $+7_{10}$, but one is subtracted by adding $(-1)$, represented here as "2": $00001000+2=00001002$. To take another example, $55_{10}$ is represented as 00110111. A similar conversion as before may be performed: $00110111+1=00111000+2=00111002$. The resulting representation contains three consecutive ones and may be further converted as follows: $00111002+1000=01000002+2000=01002002$. To take a final example, $-69_{10}$ is represented as 10111011. In modified canonical form, the most significant bit of negative constants is always "2". The conversion may be performed as follows: $20111011+1000=21000011+2000=21002011$. But "21"="02"; i.e., $(-2)2^x+(1)2^{x-1}=(0)2^x+(-2)2^{x-1}$. The modified canonical representation of $-69_{10}$ is therefore 02002011. The corresponding hardware multiplier, instead of requiring six columns of adders, requires only four. A code routine for generating modified canonical signed digit numbers appears in the Appendix.

The modified canonical signed two's complement multiplier uses, in addition to the first two kinds of adders shown in FIG. 11(a), two additional kinds of adders shown in FIG. 11(c). Each of the two additional kinds of adders has one input inverted. In the case of the fifth kind of adder, the top input is inverted, and in the case of the sixth kind of adder, the bottom input is inverted.

Figure 14:
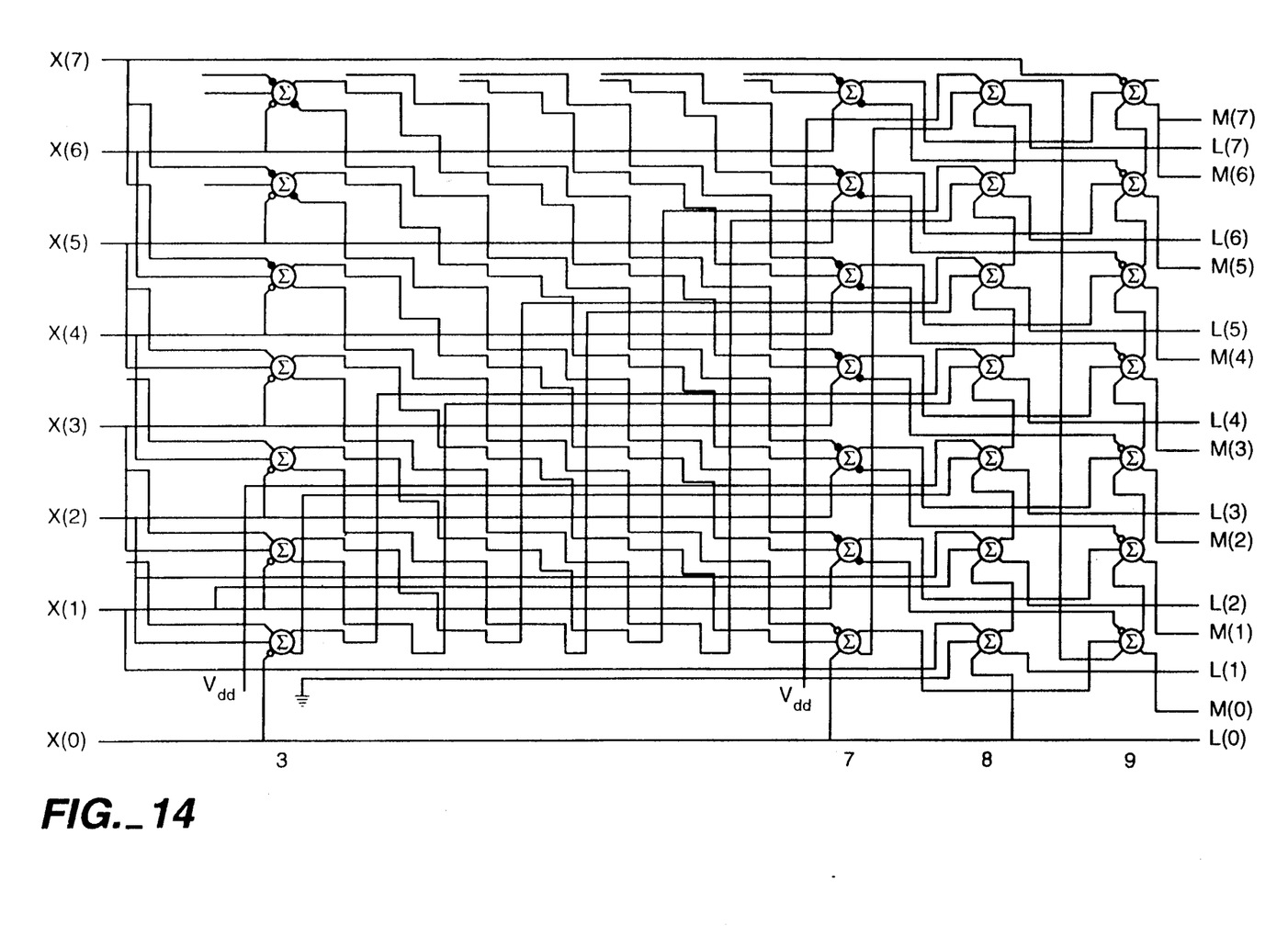
FIG. 14 is a schematic diagram of a modified canonical signed two's complement multiplier in which the constant is "10002011" (the equivalent of "01111011") where "2" represents (−1).

FIG. 14 shows the schematic of a generated constant multiplier with a fixed signed multiplicand "01111011", represented in modified canonical form as 10002011. The first column of adders remaining in the circuit is column 3. One of the inputs of the column 3 adders receives the bits of the input word in accordance with the least significant bit of the constant, which is a logic one, and another of the inputs of the column 3 adders receives the bits of the input word in accordance with the next least significant bit, also a logic one. The bottom input of the column 3 adders is inverting, and receives the bits of the input word in accordance with bit 3 of the constant, which is "2" $(-1)$. The input word therefore has each bit inverted as part of forming its two's complement. Positive one must then be added to the least significant bit in column 3. The inputs of adder 31, however, are already all used. Positive one is therefore added in adder 83, which receives the sum bit from adder 31. For this purpose, the top input of adder 83 is connected to $V_{dd}$.

In every other significant respect, the constant multiplier may be realized in identical fashion as the corresponding signed (non-canonical) two's complement multiplier. Further simplification may be obtained, however, using an additional adder 81. Recall that in the case of the signed (non-canonical) two's complement multiplier, the first adder in column 8 is adder 82, but the adders 91-97 are in effect compound adders of the type shown in FIG. 11(b). By including adder 81 in the circuit, the simpler sixth kind of adder shown in FIG. 11(c) may be used for the adders 91-97.

The foregoing has described the principles, preferred embodiments, and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of the present invention as defined by the following claims.

APPENDIX

```
generate canonical signed digit number
c1 := 0;
b1 := cvi(bin[NumBits for 1]);
csd := " ";
For i:=1 UPTO numBits - 1 DOB
    b2 := cvi(bin[NumBits-i for 1]);
    c2 := c1 + b1 + b2;
    if c2 > 1 then
        c2 := 1
    else
        c2 := 0;
    d1 := b1 + c1 - 2*c2;
    if d1 < 0 then
        rcWrite(csd, '2')
    else if d1 > 0 then
        rcWrite(csd, '1')
    else
        rcWrite(csd, '0');
    c1 := c2;
    b1 := b2;
end;
b2 := b1;
c2 := c1 + b1 + b2;
if c2 > 1 then
    c2 := 1
else
    c2 := 0;
d1 := b1 + c1 - 2*c2;
if d1 < 0 then
    rcWrite(csd, '2')
else if d1 > 0 then
    rcWrite(csd, '1')
else
```

APPENDIX -continued

```
    rcWrite(csd, '0');
ifc DoDebug thenc write(logfile,"DPcefc: In binTocsd",
" bin =",bin, eol); endc
ifc DoDebug thenc write(logfile,"DPcefc: In binTocsd",
" csd =",csd, eol); endc
    # transfer the special case "x ... x0202" to "x ... x2011"
    if csd[NumBits-3 for 4] = "0202" then
        csd := csd[1 for NumBits-4] & "2011";
    # transfer the special case "x ... x1020" to "x ... x0110"
    Is110 := false;
    if csd[NumBits-3 for 4] = "1020" then
    begin
        csd := csd[1 for NumBits-4] & "0110";
        Is110 := true;
    end;
End;
```

What is claimed is:

1. A modified canonical signed two's complement constant multiplier circuit for computing a product of a multi-bit multiplicand and a multi-bit constant that uses full adders each having three input terminals and two output terminals, a Sum output terminal and a Carry output terminal, certain ones of said input terminals and said output terminals being weighted so as to represent positive and negative numbers, other certain ones of said input terminals being of an inverting type for complementing said multi-bit multiplicand, the circuit comprising:

an interconnected array of full adders logically arranged in rows and columns, full adders in an input column each receiving different ones of said bits of said multi-bit multiplicand, full adders in each of two output columns each producing a product bit, each column besides said output columns producing a partial product, with each full adder in each row in columns besides said output columns receiving a same one of said bits of said multi-bit multiplicand;

wherein, for multi-bit constants that are neither all ones nor all zeros, a number of columns is less than said number of bits of said multiplicand, said array of full adders being interconnected such that partial products corresponding to zeros in said multi-bit constant are not produced.

* * * * *